Nov. 28, 1967 H. BECKE ET AL 3,355,636

HIGH POWER, HIGH FREQUENCY TRANSISTOR

Filed June 29, 1965 3 Sheets-Sheet 1

INVENTORS:
HANS BECKE,
ERIC F. CAVE &
DANIEL STOLNITZ

By Glenn H. Bruestle
Attorney

INVENTORS:
HANS BECKE,
ERIC F. CAVE &
DANIEL STOLNITZ
BY [signature]
Attorney

HIGH POWER, HIGH FREQUENCY TRANSISTOR

Filed June 29, 1965 3 Sheets-Sheet 3

INVENTORS:
HANS BECKE,
ERIC F. CAVE &
DANIEL STOLNITZ

BY Glenn H. Bruestle
Attorney

United States Patent Office 3,355,636

Patented Nov. 28, 1967

3,355,636

HIGH POWER, HIGH FREQUENCY TRANSISTOR

Hans Becke, Morristown, and Eric F. Cave, Somerville, N.J., and Daniel Stolnitz, New York, N.Y., assignors to Radio Corporation of America, a corporation of Delaware

Filed June 29, 1965, Ser. No. 467,885

8 Claims. (Cl. 317—234)

ABSTRACT OF THE DISCLOSURE

A glass-encapsulated transistor has emitter and base contacts made of sheets of highly doped semiconductor material joined together by a thin layer of insulating silicon dioxide to reduce the base spreading resistance of the device. The contact sheets are of the same material as the transistor to provide structural stability at high temperatures.

This invention relates generally to transistors, and more particularly to a novel transistor of the diffused type and to an improved method of making it. The novel diffused transistor of the present invention is especially useful for relatively high power and high frequency applications.

It has been proposed to make a transistor by (1) coating alternate metal plates in a stack with donor and acceptor metals, respectively, (2) insulating the coated plates from each other, and (3) forming alloyed junctions between the ends of the plates and a layer of semiconductor material of one conductivity type, the latter layer being superimposed on a layer of semiconductor material of the opposite conductivity type. Such prior art transistors are of the alloy type and do not exhibit the high frequency and high power performance characteristics of which the diffused transistors are capable. Also, such prior art transistors do not lend themselves to methods of mass production manufacture, and the coefficient of expansion of the metal plates must closely match the coefficient of expansion of semiconductor material to which they are alloyed to prevent failure of the transistors during high power applications.

A limiting factor of the highest frequency of operation obtainable by prior art diffused transistors is the value of their base spreading resistance, the latter being determined, in part, by the distance between the emitter and the base contacts. Since this distance is usually obtained by photolithographic techniques, the smallest distance is still several microns in length, even in the best prior art diffused transistors.

It is an object of the present invention to provide a novel diffused transistor and an improved method of making it that overcome the objections to the aforementioned alloyed and diffused transistors and method of manufacture of the prior art.

Another object of the present invention is to provide a novel diffused transistor whose component parts have substantially the same coefficient of expansion and that can be manufactured by an improved method that lends itself to mass production operations.

Still another object of the present invention is to provide a novel diffused transistor whose base spreading resistance can be lowered by at least one order of magnitude by the improved method of manufacture of the present invention, thereby providing a diffused transistor of higher frequency capabilities than those of the prior art.

A further object of the present invention is to provide a novel diffused transistor that is relatively simple in construction, efficient in use, and lends itself to manufacture by an improved method that is relatively easy and inexpensive to carry out.

Briefly, the novel diffused transistor comprises a laminate of two wafers, one wafer itself comprising a laminate of alternate strips of P+ type and N+ type semiconductor material bonded together by an electrical insulating material, and the other wafer comprising N type, and P type layers of semiconductor material.

The novel diffused transistor may be manufactured by pressing the wafers together so that the P type layer, comprising a major surface of one wafer, is disposed against the alternate P+ type and N+ type areas comprising a major surface of the other wafer. Such pressing is carried out for a time and at a temperature and pressure to join the wafers to each other and to diffuse donor and acceptor atoms from the N+ type and P+ type strips, respectively, into the P type layer to a depth of at least one diffusion length. Thus, diffused junctions between the P+ type and N+ type strips on the one hand and the P type layer on the other hand are formed; and the N+ type strip, the P+ type strip, and the N type layer become the emitter, base, and collector contacts, respectively, of the diffused transistor.

While the present invention will be described by an improved method of making a novel diffused NPN transistor, it is within the scope of the invention to make a novel, diffused PNP transistor also. To make the novel, diffused PNP transistor, a wafer comprising P+ type, P type, and N type layers of semiconductor material is merely substituted for the wafer of N+ type, N type, and P type layers in the aforementioned process.

The novel features of the present invention, both as to its organization and method of operation, as well as additional objects and advantages thereof, will be more readily understood from the following description, when read in connection with the accompanying drawings in which similar reference characters represent similar parts throughout, and in which.

Figure 1:
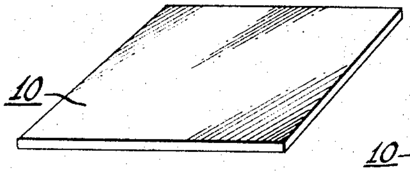
FIG. 1 is a perspective view of a sheet of semiconductor material used in the manufacture of the improved diffused transistors.

Referring now particularly to FIG. 1 of the drawings, there is shown a sheet 10 of semiconductor material, such as silicon, germanium, or gallium arsenide. The sheet 10 is preferably of rectangular shape and is formed from a single crystal of heavily doped semiconductor material such as N+ type or P+ type silicon, germanium, or gallium arsenide, for example. The sheet 10 may be about one-inch square and between five and twenty-five mils thick.

Figure 2:
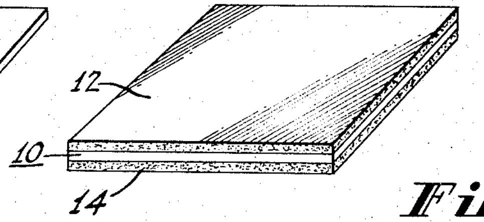
FIG. 2 is a perspective view of the sheet of semiconductor material after its opposed major surfaces have been oxidized.

An electrical insulating and physically bonding material is adherently deposited or formed on the two major surfaces of the sheet 10 by any suitable method known in the art. For example, the sheet 10 of silicon may be oxidized by heating it in steam, containing air and/or pure oxygen, to a temperature between 1200° C. and 1250° C. until the major surfaces of sheet 10 are covered with upper and lower oxide layers 12 and 14 of a desired thickness, as shown in FIG. 2. Where the sheet 10 is of silicon, the oxide layers 12 and 14 are silicon dioxide. A suitable oxide may also be formed on the sheet 10 of silicon by heating it in steam containing silicon tetrachloride or in a hydrogen carrier containing silicon tetrachloride and carbon dioxide, in a manner known in the art. Suitable oxides may also be formed on the sheet 10 by the decomposition of organic oxysilane compounds by known techniques. The oxide coated sheet 10 in FIG. 2 is shown with its peripheral edges trimmed so that the silicon sheet 10 can be seen plainly between the oxide layers 12 and 14.

Figure 3:
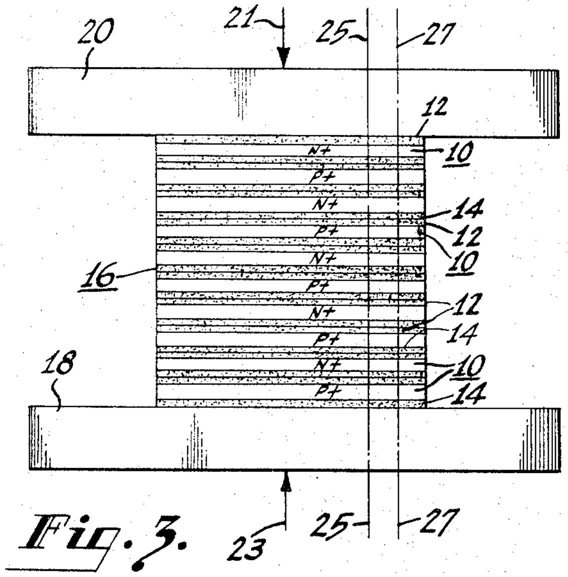
FIG. 3 is a front elevational view of a stack of oxidized sheets of semiconductor material under pressure, in one of the steps of the present method of making diffused transistors.

A plurality of oxidized sheets 10 are superimposed on each other to form a stack 16 wherein the upper oxide layer 12 of a sheet 10 is adjacent to the lower oxide layer 14 of the next higher adjacent sheet 10. The number of oxidized sheets 10 in any stack 16 will depend upon the size of the ultimate composite wafer desired. In the stack shown in FIG. 3, ten sheets 10 are superimposed upon each other to form the stack 16. For the purpose of producing a diffused transistor, the sheets 10 in the stack 16 should be alternately interleaved P+ type and N+ type semiconductor material, as indicated in FIG. 3. N+ type and P+ type semiconductor silicon has a resistivity of about 0.001 ohm-centimeter.

Figure 4:
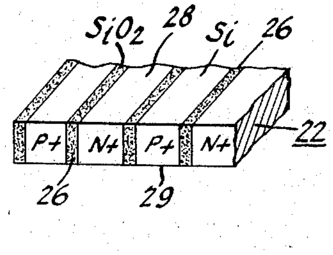
FIG. 4 is a fragmentary perspective view of a composite wafer used in the present method of making diffused transistors.

To form a composite wafer 22, shown in FIG. 4, the stack 16 is placed between parallel blocks 18 and 20 of graphite to prevent scratching of the lower oxide layer 14 and the upper oxide layer 12 of the lowermost and uppermost sheets 10, respectively. The entire assembly is then placed in a press (not shown) wherein the stack 16 is compressed by forces in the directions normal to the major surfaces of the sheets 10, as indicated by the arrows 21 and 23 in FIG. 3. Depending upon the oxide and material of sheet 10, the pressure applied between the blocks 18 and 20 may be from about 100 p.s.i. to about 2,000 p.s.i. While the pressure is applied, the stack 16 is heated, in an induuction furnace (not shown), for example, to a temperature at which the oxide layers 12 and 14 soften, usually between 1200° C. and 1250° C. for silicon, for example. Under these conditions of heat and pressure, adjacent oxide layers 12 and 14 of adjacent sheets 10 of the stack 16 fuse, that is, become bound to each other in about three minutes, and the stack 16 becomes an integral structure.

The stack 16 of fused sheets 10 is now sliced, preferably by cutting the stack 16 perpendicularly to the major surfaces of the oxide layers 12 and 14 to form the composite wafer 22, shown in FIG. 4. The wafer 22 may be a slice included between the planes indicated by the broken lines 25 and 27 illustrated in FIG. 3, having new major surfaces 28 and 29 normal to the old. Thus, the wafer 22 is a composite or laminate of alternate strips of N+ type and P+ type semiconductor material, of rectangular cross-section, separated from each other by fused silicon dioxide 26, a good electrical insulator; and each of the major surfaces 28 and 29 comprises alternate areas of N+ type and P+ type semiconductor material.

Figure 5:
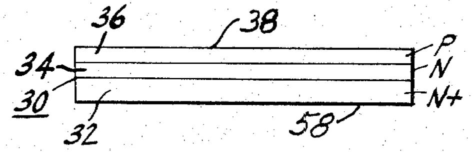
FIG. 5 is a front elevational view of another wafer of semiconductor material used in the present method of making diffused transistors.

Referring now to FIG. 5 of the drawings, there is shown a wafer 30 of semiconductor material that is also used in making the diffused transistor of the present invention. The wafer 30 comprises a laminate including a substrate layer 32 of N+ type semiconductor material, an N type layer 34 of semiconductor material, and a P type layer 36 of semiconductor material. The wafer 30 has upper and lower major surfaces 38 and 58. The semiconductor material of the wafer 30 may, e.g., be silicon, germanium, or gallium arsenide, and the layers 34 and 36 may be disposed on the substrate layer 32 by any suitable means, as by epitaxial deposition, described in RCA Review, volume XXIV, Number 4, December, 1963, for example. The layers 32, 34, and 36 may also be produced by impurity diffusion methods well known in the semiconductor technology. The N+ type layer 32, the N type layer 34, and the P type layer 36 may have typical resistivities in the order of about 0.001 ohm-cm., 5 ohm-cm., and 1 ohm-cm., respectively.

A plurality of diffused transistors are formed by joining the composite wafer 22 to the wafer 30. This is accomplished by disposing the major surface 29 of the wafer 22 against the major surface 38 of the wafer 30 and applying sufficient pressure and heat between the wafers for a time sufficient to fuse them to each other and to diffuse donor and acceptor atoms from the N+ type and P+ type strips, respectively, of the wafer 22 into the P type layer 36 to a depth of at least one diffusion length. The diffusion length is the linear distance in which the concentration of the charge carriers falls, due to recombination, to $l/e$ of its original value, $e$ being the base of natural logarithms. The time, temperature, and pressure of this fusing operation is adjusted so as to obtain an outdiffusion (i.e. a release of impurities) from the P+ type and N+ type strips of the wafer 22 to yield a desired basewidth and to move the emitter junction at least one diffusion length away from the original interface between the wafers 22 and 30. The outdiffusion from the N+ type strips forms PN junctions 40 with the P type layer 36 at least one diffusion length from the interface between the wafers, and the outdiffusion from the P+ strip tends to lower the base spreading resistance in the P type layer 36. This procedure reduces possible interference of crystal imperfections at the interface with transistor performance. If the conditions for producing the diffusion of donor and acceptor atoms from the N+ type and P+ type strips into the P type layer 36 are not compatible with the conditions for fusing the wafers 22 and 30 together, an additional diffusion operation may be carried out independently in a standard diffusion furnace subsequent to the fusing operation, in a manner well known in the art.

Where the wafers 22 and 30 are of silicon, they may be fused together and the PN junctions 40 formed under a pressure between 500 p.s.i. and 10,000 p.s.i. and a temperature between 1,000° C. and 1,300° C. applied for a time between one minute and several hours. Where the wafers 22 and 30 are of germanium or gallium arsenide, the heating temperature range is between 700° C. and 900° C., the rest of the conditions remaining substantially the same as for silicon.

Figures 6, 7:
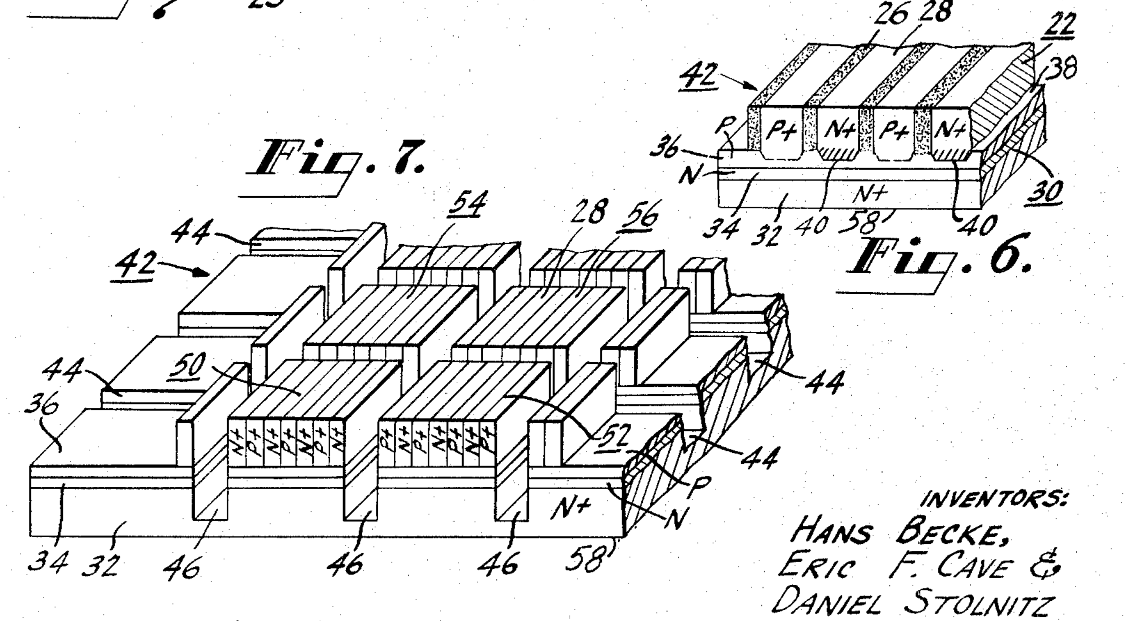
FIG. 6 is a fragmentary perspective view of the composite wafer illustrated in FIG. 4 fused to the wafer illustrated in FIG. 5, during one of the operations of the present method of making diffused transistors.
FIG. 7 is a fragmentary perspective view showing grooves formed in the fused wafers prior to a glassing operation in accordance with the present method.

In the fused laminate 42, comprising the joined wafers 22 and 30, the N+ type strips 28, the P+ type strips 29, and the N+ type layer 32 comprise emitter, base, and collector contacts, respectively, of a diffused NPN transistor. While only one N+ type strip and P+ type strip is necessary to form the emitter and base contacts of a separate diffused transistor, the N+ type layer 32 being a collector contact common to all of the diffused transistors, it is usually desirable to produce diffused transistors wherein a number of N+ type strips are connected in common to form a combined emitter contact and a number of P+ type strips are connected in common to provide a combined base contact. With this arrangement, a diffused transistor has a larger current-carrying capacity than is possible with only a single N+ type strip and a single P+ type strip for its respective emitter and base contacts. Thus, a number of discrete diffused transistors can be formed from the fused laminate 42 by forming in the fused laminate 42 one series of parallel spaced-apart grooves 44 disposed at substantially right angles to another series of parallel spaced-apart grooves 46, as shown in FIG. 7. The grooves 44 and 46 pass completely through the wafer 22 and extend well into the wafer 30. The grooves 44 and 46 may be formed by machining, sawing, or ultrasonic operations well known in the art.

The mesas in the fused laminate 42 (FIG. 7) defined by the grooves 44 and 46, comprise, for example, diffused transistors 50, 52, 54 and 56 wherein a number of N+ type strips and P+ type strips will be connected in common to form the emitter and base contacts, respectively, of the diffused transistors, the N+ type layer being a collector electrode common to all of the diffused transistors so formed.

The fused laminate 42 is etched in any suitable etching solution and then oxidized by any one of the aforementioned methods of oxidation, thus passivating the exposed parts of the emitter and collector junctions.

Figure 7A:
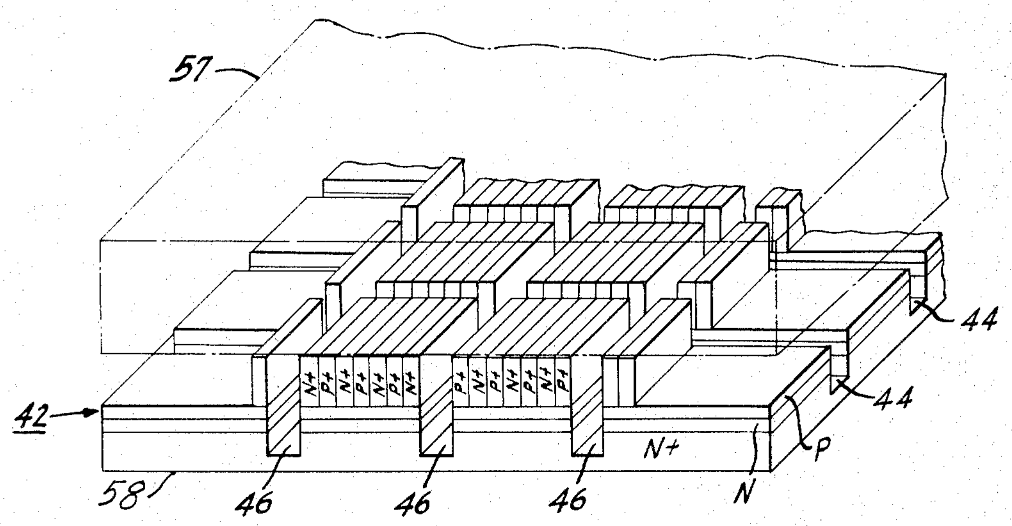
FIG. 7A is a view similar to that of FIG. 7, but showing a wafer of glass (in phantom) disposed on the fused wafers of semiconductor material prior to softening the glass and forcing it into the grooves.
Figure 8:
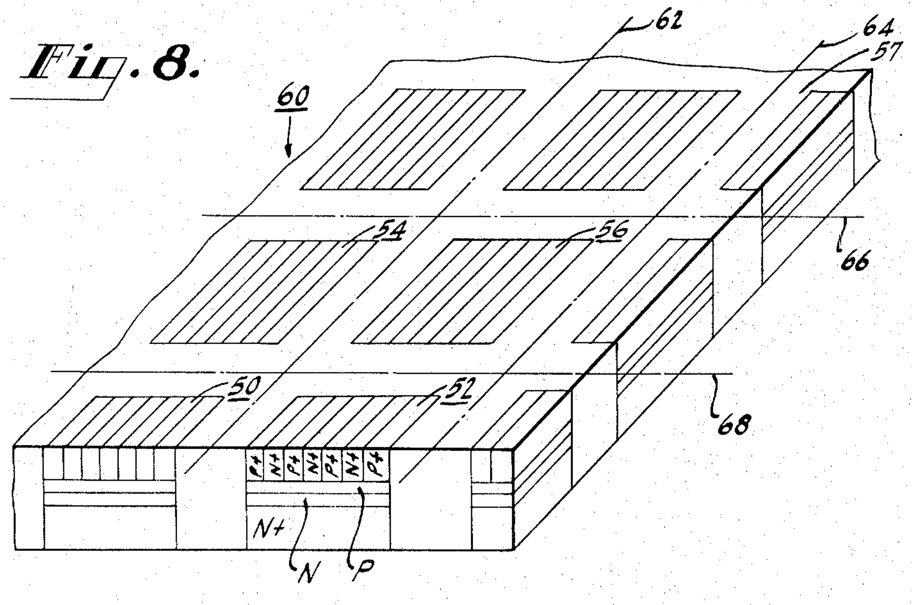
FIG. 8 is a fragmentary perspective view of a plurality of diffused transistors after the glassing operation in accordance with the present method.

Insulating and passivating material is now disposed in the grooves 44 and 46. This is accomplished by placing a wafer of suitable glass 57 (FIG. 7A), such as a lime-alumino-silicate glass (e.g. #1715 glass, #7070 glass, or "Pyrex" glass, manufactured by the Corning Glass Company) on the upper surface 28 of the grooved, fused laminate 42 and heating, as in an induction furnace (not shown), to the softening point of the glass 57 while pressing the latter into the grooves 44 and 46 (FIG. 8). The upper and lower surfaces 28 and 58 of the fused laminate 42 are now lapped. The surface 58 is lapped to a depth below the floor of the grooves 44 and 46 so that the diffused transistors 50, 52, 54 and 56 are completely isolated from each other by the glass 57, as shown in FIG. 8.

The P+ type strips, N+ type strips, and the N+ type layer are metallized to provide means to which electrical connections can be easily and conveniently made. This is achieved conveniently by immersing the glassed, fused laminate 60, shown in FIG. 8, in a nickel plating immersion bath. The latter bath is preferably of the type wherein nickel plates onto the P+ type and N+ type strips and the N+ type layer when the glassed fused laminate 60 is immersed in the solution. Such nickel plating immersion solutions are well known in the art. In the immersion nickel plating process, nickel is plated onto the semiconductor material only, no nickel adhering to the silicon dioxide 26 between the P+ type and N+ type strips. The glassed fused laminate 60 is dipped next in solder to provide a coating of solder on the nickel plating. Other methods, such as metal evaporation methods, can also be used to plate the contacts of the diffused transistors, but the immersion nickel plating method is preferred because it avoids the use of masking procedures.

Discrete diffused transistors, such as the diffused transistors 50, 52, 54 and 56, for example, can now be separated from each other by cutting through the glass 57 as along the dashed lines 62, 64, 66 and 68, for example.

Figure 10:
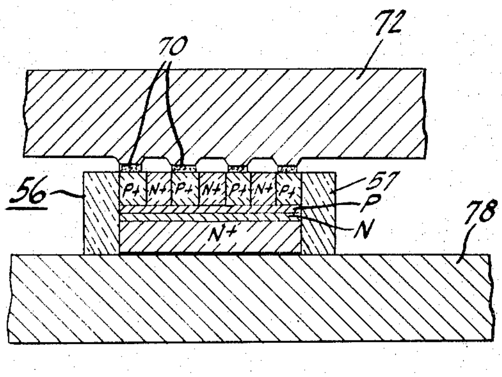
FIG. 10 is a fragmentary cross-sectional view taken along the line 10—10 in FIG. 9.
Figure 9:
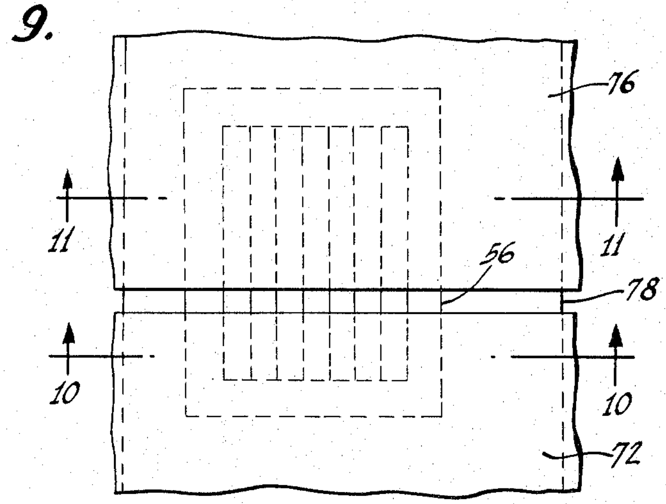
FIG. 9 is a fragmentary plan view of one embodiment of the improved diffused transistor, showing the application of emitter and base heat sinks thereto.
Figure 11:
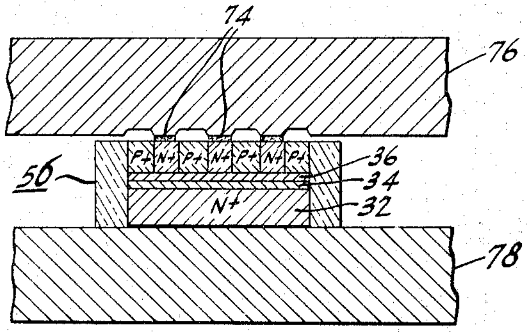
FIG. 11 is a fragmentary cross-sectional view taken along the line 11—11 in FIG. 9.

Referring now to FIGS. 9, 10 and 11 there is shown a diffused transistor 56 wherein all of the P+ type strips are connected by parallel ridges 70 in a metal base heat sink 72. The heat sink may be a heavy sheet of copper and can be connected to the P+ strips by means of solder to comprise the base terminal of the diffused transistor 56, as shown in FIG. 10. The N+ type strips of the diffused transistor 56 are soldered to ridges 74 of an emitter heat sink 76 to form a common emitter terminal and to dissipate heat. The N+ layer is soldered to a collector heat sink 78, as shown in FIGS. 10 and 11.

From the foregoing description, it will be apparent that there has been provided a novel diffused transistor and an improved method of making it. The diffused transistor is well suited for high power applications because heat sinks can be applied to oposite sides thereof, thereby providing excellent terminal heat dissipation. Also, the component wafers of the diffused transistor have substantially the same coefficient of expansion, rendering structural stability to the transistor at high temperatures of operation. The diffused transistors have a very low $R_{bb}$, base spreading resistance, due to the P+ type base fusion and the proximity of the base contact to the emitter contact. This base spreading resistance is determined by the thickness of the silicon oxide layer between the N+ type and P+ type strips, and this thickness can be a fraction of one micron, resulting in transistors capable of providing signals of high frequency. The diffused transistors are hermetically sealed by glassing, are very rugged, and are made by a simple process that does not require thermal compression bonding operations or photolithographic techniques.

While only one embodiment of the diffused transistor and method of making it have been described, variations in the structure of the transistor and in the operations of the method, all coming within the spirit of this invention, will, no doubt, suggest themselves to those skilled in the art. Hence, it is desired that the foregoing description shall be considered as illustrative and not in a limiting sense.

What is claimed is:

1. A semiconductor device comprising:

a body of semiconductor material which includes two layers of mutually opposite conductivity types, a surface of one of said layers being substantially planar and constituting a major surface of said body, a region of conductivity type opposite to that of said one layer disposed at said surface and occupying only a limited portion thereof, first electrode means comprising a first strip of highly conductive semiconductor material of the same conductivity type as that of said region fused to said surface only within said region and extending transversely: to said surface, and second electrode means comprising another strip of highly conductive semiconductor material of conductivity type opposite to that of said region, laminated to said first strip with an insulating material and fused to said surface only outside of said region.

2. A semiconductor device comprising:

a body of semiconductor material which includes base and collector layers of mutually opposite conductivity types and forming a PN junction therebetween, a surface of said base layer being substantially planar and constituting a major surface of said body, an emitter region of conductivity type opposite to that of said base layer disposed at said surface, occupying only a limited portion thereof and forming a PN junction with said base layer, first electrode means comprising a first strip of degenerate semiconductor material of the same conductivity as that of said emitter region fused to said surface only within said limited portion thereof and extending away from said base layer, and second electrode means comprising another strip of degenerate semiconductor material of the same conductivity as that of said base layer, fused to said surface of said base layer only outside said limited portion of said surface, and bonded to said first strip with an insulating material.

3. A transistor comprising:

a first wafer comprising N type and P type layers of semiconductor material, a second wafer comprising alternate strips of N+ type and P+type semiconductor material, said strips being bonded together by electrical insulating material, a major surface of said first wafer comprising and P+ type semiconductor material, said strips be- a major surface of said P type layer being fused to a major surface of second wafer, acceptor and donor atoms of said P+ type and N+ type strips, respectively, being diffused into said P type layer to a depth equal to at least one diffusion length, said N+ type strips and said P+ strips comprising the emitter and the base contacts, respectively, of said transistor.

4. A transistor comprising:
a first wafer comprising P type and N type layers of semiconductor material,
a second wafer comprising alternate strips of P+ type and N+ type semiconductor material, said strips being bound together by electrical insulating material, a major surface of said first wafer comprising a major surface of said N type layer being fused to a major surface of said second wafer, acceptor and donor atoms of said P+ type and N+ type strips being diffused into said N type layer to a depth equal to at least one diffusion length, said N+ type strips and said P+ type strips comprising the emitter and the base contacts, respectively, of said transistor.

5. A diffused type transistor comprising:
two wafers fused to each other, one of said wafers comprising alternate strips of P+ type and N+ type silicon, bound to, and insulated from, each other by silicon dioxide, the other of said wafers comprising N+ type, N type, and P type layers of silicon in the order named,
acceptor atoms from said P+ type strips being diffused into said P type layer,
donor atoms from said N+ type strips being diffused into said P type layer and forming PN junctions therein, at least one of said N+ type strips, one of said P+ type strips, and a portion of said N+ type layer comprising the emitter, base, and collector terminals, respectively, of said transistor, and the periphery of said wafers between the major surfaces thereof being surrounded by an insulating material.

6. A diffused type transistor comprising:
two wafers fused to each other, one of said wafers comprising alternate strips of P+ type and N+ type silicon bound to, and insulated from, each other by silicon dioxide, the other of said wafers comprising P+ type, P type, and N type layers of silicon in the order named,
acceptor atoms from said P+ type strips being diffused into said N type layer and forming PN junctions therein, donor atoms from said N+ type strips being diffused into said N type layer, at least one of said P+ type strips, one of said M+ type strips, and a portion of said P+ type layer comprising the emitter, base, and collector terminals, respectively, of said transistor, and the periphery of said wafers between the major surfaces thereof being surrounded by an insulating material.

7. A diffused type transistor comprising:
two wafers of semiconductor material fused to each other, one of said wafers comprising alternate strips of P+ type and N+ type semiconductor material separated from each other by an insulating material, the other of said wafers comprising N type and P type layers of semiconductor material,
acceptor atoms from said P+ type strips being diffused into said P type layer,
donor atoms from said N+ type strips being diffused into said P type layer and forming PN junctions therein,
an emitter heat sink comprising a metal electrically connected to said N+ type strips,
a base heat sink comprising a metal electrically connected to said P+ type strips, and
a collector heat sink electrically connected to said N type layer, said emitter heat sink, said base heat sink, and said collector heat sink comprising emitter, base, and collector terminals, respectively, of said transistor.

8. A diffused type transistor comprising:
two wafers of semiconductor material fused to each other, one of said wafers comprising alternate strips of P+ type and N+ type semiconductor material separated from each other by an insulating material, the other of said wafers comprising P type and N type layers,
acceptor atoms from said P+ type strips being diffused into said N type layer and forming PN junctions therein,
donor atoms from said N+ type strips being diffused into said N type layer,
an emitter heat sink comprising a metal electrically connected to said P+ type strips,
a base heat sink comprising a metal electrically connected to said N+ type strips, and
a collector heat sink electrically connected to said P type layer, said emitter heat sink, said base heat sink, and said collector heat sink comprising emitter, base, and collector terminals, respectively, of said transistor.

References Cited

UNITED STATES PATENTS

| | | | |
|---|---|---|---|
| 3,044,147 | 7/1962 | Armstrong | 317—235 |
| 3,091,701 | 5/1963 | Statz | 317—235 |
| 3,114,865 | 12/1963 | Thomas | 317—235 |
| 3,166,448 | 1/1965 | Hubner | 317—235 |
| 3,171,068 | 2/1965 | Denkewalter et al. | 317—235 |
| 3,217,212 | 11/1965 | Ryder | 317—234 |
| 3,276,105 | 10/1966 | Alais et al. | 317—234 |
| 3,290,760 | 12/1966 | Cave | 317—235 |

JOHN W. HUCKERT, *Primary Examiner.*

R. F. POLISACK, *Assistant Examiner.*